(12) United States Patent
King (10) Patent No.: US 6,262,676 B1
(45) Date of Patent: Jul. 17, 2001

(54) BINARY CODE CONVERTERS AND COMPARATORS

(75) Inventor: Douglas B.S. King, Warton (GB)

(73) Assignee: BAE Systems plc, Farnborough (GB)

( * ) Notice: Subject to any disclaimer, the term of this patent is extended or adjusted under 35 U.S.C. 154(b) by 0 days.

(21) Appl. No.: 09/368,585

(22) Filed: Aug. 5, 1999

Related U.S. Application Data (63) Continuation of application No. PCT/GB98/03834, filed on Dec. 18, 1998.

(30) Foreign Application Priority Data

Dec. 19, 1997 (GB) .................................................. 9726752
Oct. 27, 1998 (GB) .................................................. 9823361

(51) Int. Cl.[7] .................................................. H03M 7/16
(52) U.S. Cl. .................................................. 341/96
(58) Field of Search .............................. 341/159, 64, 94, 341/96, 158, 160

(56) References Cited

U.S. PATENT DOCUMENTS 5,029,305 * 7/1991 Richardson ........................ 341/159
5,382,955   1/1995 Knierim .
5,459,466  10/1995 Knierim et al. .

FOREIGN PATENT DOCUMENTS 0 217 009   4/1987 (EP) .
0 221 238   5/1987 (EP) .
0 533 253   3/1993 (EP) .
2 223 369   4/1990 (GB) .
7-95091     4/1995 (JP) .

OTHER PUBLICATIONS

"Pipelined Thermometer Decoder", *IBM Technical Disclosure Bulletin*, vol. 31, No. 6, Nov. 1, 1988, pp. 401–403.

* cited by examiner

Primary Examiner—Brian Young
(74) Attorney, Agent, or Firm—Nixon & Vanderhye P.C.

(57) ABSTRACT

A thermometer code converter for converting weightless binary tuples of 2 or higher dimensional arrays into a thermometer or aggregate code comprises a series of layers (16, 18) each made up of bit manipulation cells (10) which collectively cause set bits to be shifted towards a required bit position. The bit manipulation cells are made up of logic elements (12, 14) and the entire converter may be asynchronous. Also disclosed is a sum and threshold device which employs a thermometer code converter and a bit selector device.

42 Claims, 12 Drawing Sheets

Odd/Even Layer Overlap for n>2 e.g. for n=3

(a)

or (b)

e.g. for n=4

(a)

(b)

(c)

Similarly for larger values of n

|    | c₁ c₂ c₃ c₄ c₅ c₆ |
|----|-------------------|
| R1 | 0 0 1 0 0 0 |
| R2 | 0 1 1 1 0 0 |
| R3 | 1 1 0 1 0 1 |
| R4 | 1 0 0 0 1 0 |
| R5 | 0 0 1 1 0 1 |
| R6 | 0 0 0 1 0 0 | a) Input b) 1st layer output c) 2nd layer output d) 3rd layer output e) 4th layer

Aggregate code output

BINARY CODE CONVERTERS AND COMPARATORS

This Application is a continuation of PCT/GB98/03834 Dec. 18, 1998.

BACKGROUND OF THE INVENTION

1. Field of the Invention

This invention relates to apparatus and methods for converting a weightless tuple or vector into thermometer code and also to apparatus and methods for determining the Hamming value comparator relationship of two thermometer codes or weightless vectors. The invention also extends to arrangements for converting 2-dimensional arrays of data into aggregate code in which set bits are aggregated or clustered around a focal bit position, in a manner analogous to that of converting 1-dimensional tuples or vectors, and such aggregate code is also referred to herein generally as thermometer code.

2. Discussion of Prior Art

The apparatus and methods described herein may usefully incorporate, utilise, be used with or be incorporated into any of the apparatus or methods described in our co-pending U.K. Patent Application No. 9726752.0 or our co-pending International Patent Applications Nos. PCT/GB98/. . . , PCT/GB98/. . . , PCT/GB98/. . . , or PCT/GB98/. . . (our References XA1000, XA1154, XA1155, XA1156).

Terminology

The term "Hamming value" is used to define the number of bits set (i.e. 1's set) in 1-dimensional arrays such as a binary number, tuple, vector, or in 2 or higher dimensional arrays. The Hamming value relationship of two binary numbers or arrays indicates which has the greater Hamming value or whether the Hamming values are the same.

The term "weighted binary" is used in the conventional sense to indicate that successive bit positions are weighted, particularly . . . 16, 8, 4, 2, 1 although other weighted representations are possible. "Weightless binary" is a set of binary digits 1 and 0, each representing just "1" and "0" respectively. There is no least significant bit (LSB) or most significant bit (MSB). The set of bits may be ordered or without order. If all the 1's are grouped together e.g. [111000] then the code is referred to as a thermometer code, thermocode or bar graph code, all collectively referred to herein as "thermometer codes".

A set of weightless bits is referred to herein as a "weightless tuple" or "weightless vector" and these terms are not intended to be restricted to ordered sets.

In traditional neural networks, a real-valued synaptic value is multiplied by a synaptic connection strength or weight value, and summed with other similarly treated synapses before they are all summed and thresholded to form a neural output. The weight value is a real-valued synaptic connection strength and hence the common usage of the term "weighted neural network". However, it is also possible to have binary RAM-based neural networks that do not employ real-valued connection weights but instead rely on the values of the binary bits being either 0 or 1. Accordingly, there are two contexts of weightlessness: without synaptic connection strength, and without binary code weighting. The arrangements described herein employ weightless binary manipulation mechanisms and may be used to engineer weightless artificial neural networks, otherwise referred to as weightless-weightless artificial neural networks.

Thermometer code converters may be used in the processing of two weightless vectors to compare their Hamming values. This process is broadly equivalent to the function of a binary neuron. If the neuron receives a vector, A, of weightless synaptic values (e.g. [10110010]), and a vector, T, of weightless neural threshold values (e.g. [00101000]), the neuron may be required to fire because the Hamming value of A is greater than the Hamming value of T. In this example, the threshold, T, can be thought of as a set of inhibitory synaptic values which must be exceeded if the neuron is to be fired. This is one particular example of an instance where it is required to determine the Hamming value relationship between two binary vectors, but there are very many other types of systems requiring this or similar processing. For example, this comparison and the other techniques disclosed herein may be used in flight control systems, voting systems with redundancy, safety critical systems, telecommunications systems, decision making systems, and artificial intelligence systems, such as neural networks.

In a prior art arrangement, a state machine based system is used to count the number of 1's set and digital arithmetic units are used for the binary comparison. For each weightless vector, each bit is scanned sequentially and a counter or arithmetic register incremented accordingly to evaluate the Hamming value. Thereafter, the contents of the respective counters or arithmetic registers are compared to determine the Hamming value relationship. This prior art technique is suited to implementation in software, using a microprocessor or similar state machine. However, this technique is slow and prone to both conductive and emissive radio frequency interference (RFI) as it relies principally on clocks, counters and microprocessors. Both the speed of operation and susceptibility to disruption or corruption by other noise makes such a system ill-suited for safety critical systems such as flight control systems. By way of illustration, a flight control system may need to make rapid decisions based on the instantaneous "HIGH" or "LOW" state of several transducers reporting various aspects of the aircraft operation; corruption of one of the inputs to the decision making process (caused e.g. by noise or RFI disruption) could result in misinterpretation of one of the inputs with the result that the decision making processor or neural network make the wrong decision with potentially catastrophic consequences.

SUMMARY OF THE INVENTION

Although of particular use in effecting Hamming value comparison, the thermometer code converters described herein may be used in many different applications.

According to one aspect this invention provides an encoder for converting a weightless binary array of one or more dimensions into a thermometer code as herein defined, said encoder comprising means for inputting said binary weightless array into processing means having a succession of one or more layers of bit manipulation cells each cell including at least two inputs and at least two outputs, and arranged to shift set bits in said array in the direction of a selected portion of said array, thereby to provide said thermometer code.

In some arrangements said processing means is operable to shift said set bits to one end of the array. Alternatively, said processing means may be operable to shift said set bits towards the centre of the array.

The bit manipulation cells may each have just two inputs and two outputs. In this instance on application of inputs, (a, b), the manipulator cell preferably provides outputs (Ya, Yb) as follows:

Ya=a # b

Yb=a & b,     (Equation Set (1))

where 190 is the OR function and & is the AND function

In another arrangement, the bit manipulation cells may have three inputs and three outputs. Here, on application of three inputs (a, b, c,) the manipulation cell preferably provides outputs (Ya, Yb, Yc), as follows:

Ya=a # b # c

Yb=(b & c) # (a & c) # (a & b)

Yc=a & b & c     (Equation Set (2))

In yet a further arrangement, the bit manipulation cells may have four inputs and four outputs. Here on application of four inputs (a, b, c, d), the manipulation cell preferably provides outputs (Ya, Yb, Yc, Yd) as follows:

Ya=a # b # c # d

Yb=(d & c) # (d & b) # (d & a) # (c & b) # (c & a) # (b & a)

Yc=(d & c & b) # (d & c & a) # (d & b & a) # (c & b & a)

Yd=a & b & c & d     (Equation Set (3))

The parallel processing preferably means comprises alternate odd and even layers of respective odd and even numbers of bit manipulation cells, wherein in the odd layers the bit manipulation cells operate on adjacent bits starting on an even boundary of the binary string, and in the even layers, the bit manipulation cells preferably operate on adjacent bits starting on an odd boundary of the binary string.

Preferably said parallel processing array is asynchronous, although it may include pipeline register means arranged after one or more of said layers of manipulation cells for storing a partially converted string, or it may comprise a registered state machine. In this instance, the registered state machine may comprise at least two adjacent layers of bit manipulation cells, an output register for storing a partially or wholly converted binary string from the lowermost layer, and means operable to pass a partially converted string from said register to the input of the uppermost layer, and output means for outputting said thermometer code. Where an odd number of layers is required, the state machine may include a further layer of bit manipulation cells for operating on the output of said output register.

In another aspect, this invention provides a method for converting a weightless binary one or more dimensional array into a thermometer code, which comprises applying said weightless binary array to the input of a processing means having a succession of one or more layers of bit manipulation cells, thereby successively to shift set bits in said array to a selected portion of said array.

In a further aspect this invention provides an encoder for converting a weightless binary sting into a binary code, comprises a plurality of inputs, a plurality of outputs, and a plurality of logic elements for shifting set bits applied to said inputs in a given direction.

In yet another aspect this invention provides an encoder for converting a weightless binary 2-dimensional array binary data bits to aggregate set bits in said data around a pre-set location, said encoder comprising means for inputting said 2-dimensional array of data into processing means comprising a plurality of layers of bit manipulation cells, each including at least two inputs and outputs, with said bit manipulation cells being interconnected between layers thereby collectively to shift set bits in said string towards said preset location.

Preferably said processing means comprises alternate layers, ones of said layers comprising an array of 4-bit manipulator cells, and others of said layers comprising a central array of 4-bit manipulator cells with peripheral 2-bit manipulator cells and pass throughs.

The invention also extends to a sum and threshold device comprising an encoder as set out above, and means for selecting a bit position at the output of said encoder, thereby to apply a threshold. The sum and threshold device may also include one or more further selection means thereby to apply a plurality of thresholds, and the or each selection means may comprise a weighted binary selector.

Whilst the invention has been described above, it extends to any inventive combination of the features set out above or in the following description.

BRIEF DESCRIPTION OF THE DRAWINGS

The invention may be performed in various ways, and, by way of example only, various embodiments thereof will now be described in detail, reference being made to the accompanying drawings which utilise the conventional symbols for logic gates and, in which:

FIGS. 4(*a*), 4(*b*) & 4(*c*) are circuit diagrams of 2-, 3-, and 4-bit manipulator cells respectively for making up a thermometer code converter in accordance with this invention;

DESCRIPTION OF PREFERRED EMBODIMENTS

Thermometer Code Converter

Figure 1:
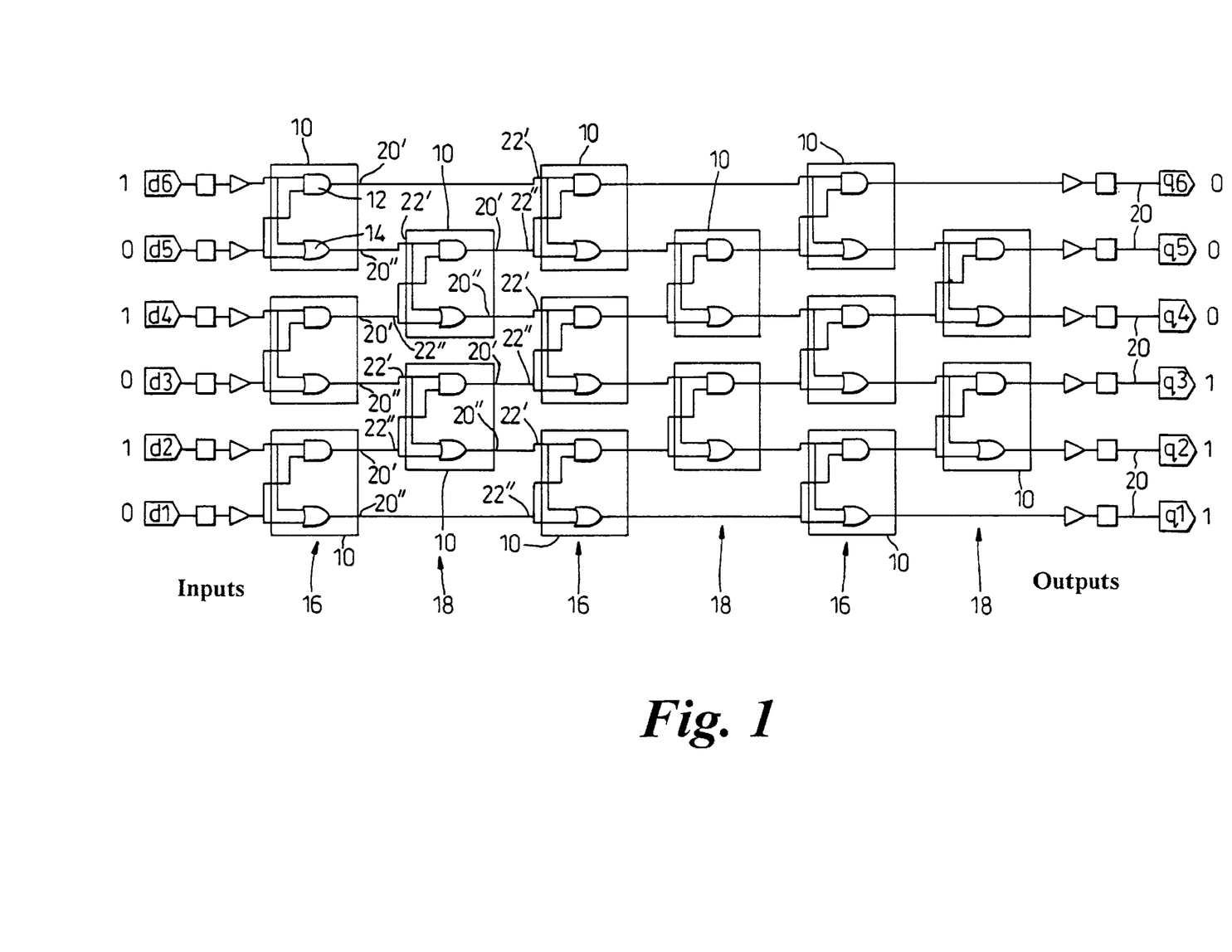
FIG. 1 is a circuit diagram of an embodiment of a thermometer code converter in accordance with one aspect of this invention, for converting weightless binary into thermometer code.
Figure 2:
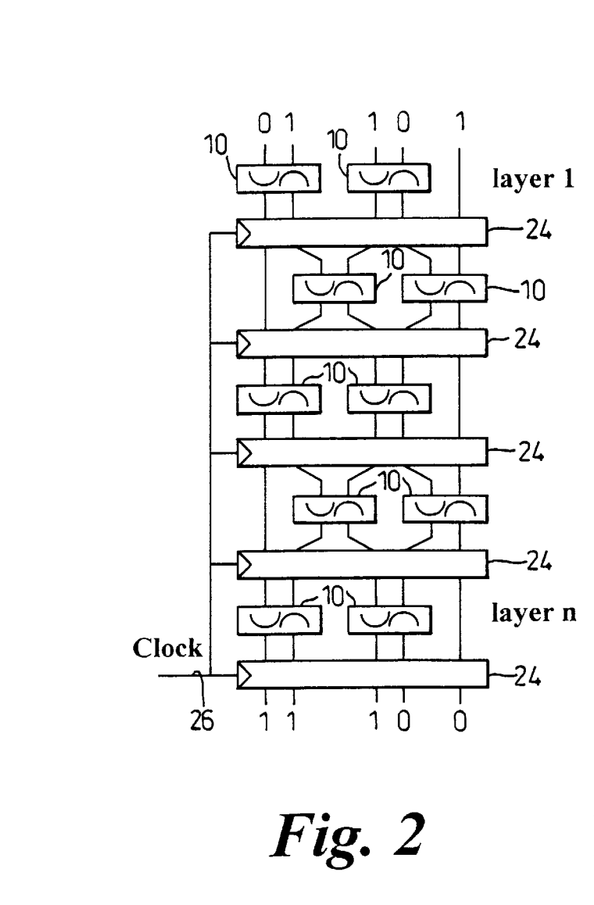
FIG. 2 is a block diagram of another embodiment of thermometer code converter operating on generally similar principles to the embodiment of FIG. 1, but in a pipelined implementation.
Figure 3:
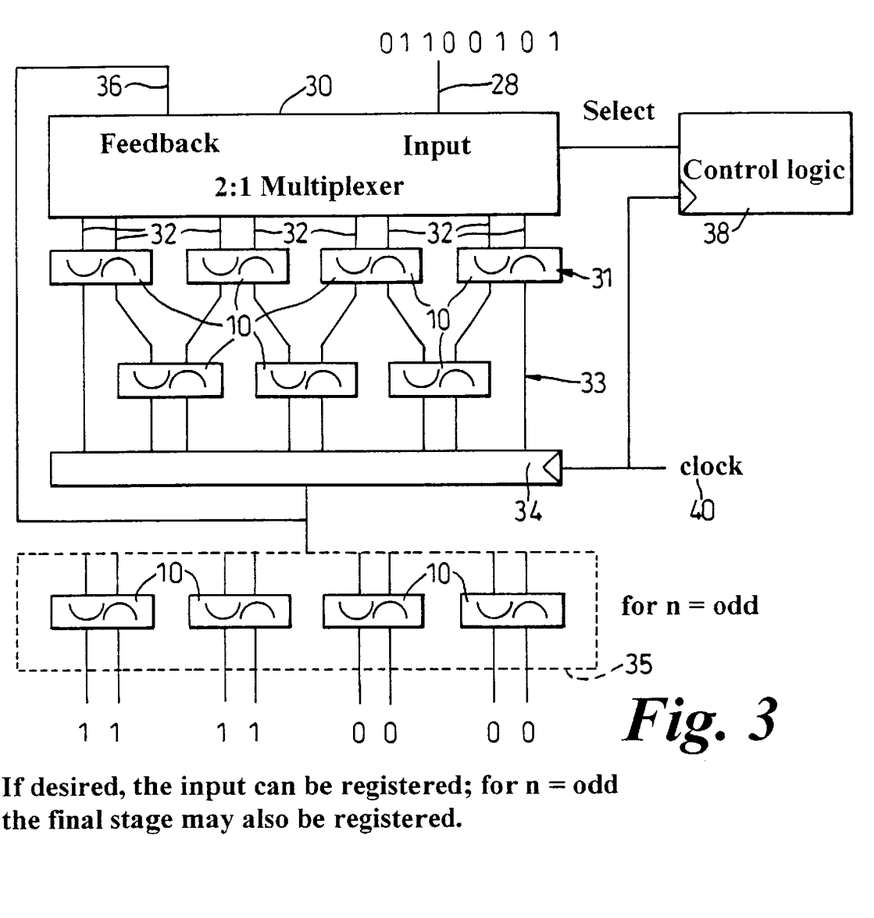
FIG. 3 is a block diagram of a further embodiment of thermometer code converter operating on generally similar principles to the embodiment of FIG. 1, but implemented as a registered state machine.

Referring now to FIGS. 1 to 3 of the drawings, there is shown an embodiment of thermometer code converter for converting a binary vector into thermometer code in various implementations. Each implementation makes use of a parallel array of bit manipulation cells 10 each having the same function. Each bit manipulation cell 10 has two inputs and two outputs and provides the following mappings:

Inputs (00) (01) (10) (11) are mapped to:

Output (00) (10) (10) (11)

In this mapping, if the leftmost bit is called B and the rightmost bit is called A, the logical mapping is:

B maps to A OR B and A maps to A AND B, or stated alternatively Yb=a & b, and Ya=a # b, where # is the OR function and & is the AND function, and Ya and Yb are the outputs.

Accordingly, it will be noted that each bit manipulation cell in this example comprises and AND gate 12 and an OR gate 14. The two input, two output bit manipulation cells 10 are arranged in alternate odd and even layers 16 and 18 respectively and interconnected in a staggered fashion such that, for each bit manipulation cell 10, the two outputs pass to respective different bit manipulation cells in the next layer. Thus, in the particular implementation shown, the first layer comprises three bit manipulation cells 10. The upper output 20' of the uppermost input layer bit manipulation cell 10 as viewed in FIG. 1 passes to the upper input 22' of the uppermost bit manipulation cell in the third layer. The lower output 20" of the uppermost input layer bit manipulation cell passes to the upper input 22' of the uppermost second layer bit manipulation cell. The upper output 20 ' of the next first layer bit manipulation cell passes to the lower input 22' of the uppermost second layer bit manipulation cell. The lower output 20" of the next first layer bit manipulation cell passes to the upper input 22' of the next second layer bit manipulation cell 10, and so on.

Although in the present example the first layer comprises just three bit manipulation cells 10, in general the process is repeated in like manner until the lowermost bit manipulation cell of the input layer, where the upper output 20' passes to the lower input 22" of the lowermost second layer bit manipulation cell 10, and the lower output 20" passes to the lower input 22" of the lowermost third layer bit manipulation cell 20. This connection pattern is repeated throughout the matrix until the outputs 20. The number of cells and number of layers required depend on the width of the words to be converted and can be determined empirically, to give a stable output for all possible input states.

Referring to the input:output mapping set out above it will be noted that the only change effected by the mapping is to map (01) to (10). This mapping has been selected to cause a set bit to be shifted to the left if there is room (i.e. if the input left bit is 0).

In use, the bits of a binary vector are applied to the respective inputs of the converter and successive layers of the converter shift the set bits to the left. The first and odd numbered layers operate on even boundaries of the binary word whereas the second and even layers operate on the odd boundaries, whereby set bits are caused progressively to migrate to the left of the binary word so that, at the output, as seen in FIG. 1, all the set bits are grouped together (i.e. (010101) has been converted to (111000).

The array may be configured to operate on arbitrary length weightless binary strings, by providing an appropriate number of bit manipulation cells in the input layer and an appropriate number of layers. The converter may also be configured to operate on binary vectors having an odd number of bits; this can be achieved either by padding the vector with zeroes to make it even or by giving one of the inputs a "bye" into the next layer as seen in the example of FIG. 2.

It will be appreciated of course that the arrangement can be configured to shift the set bits collectively in the opposite direction, for example by providing a mapping wherein the only the input (10) was altered by the mapping, namely to (01). Further, as to be described below, the set bits may be shifted to aggregate or cluster around any preset bit position.

Referring now to FIG. 2, the thermometer code converter of FIG. 1 may be modified to the pipelined implementation shown in FIG. 2. Here, A 5-bit pipeline register 24 is disposed between each layer of bit manipulation cells 10. In both FIGS. 2 and 3 below, the bit manipulation cells 10 perform the same logic combination and mapping of the bit manipulation cells of the embodiment of FIG. 1, with the logic OR gates 14 indicated by the symbol ∪ and the logic AND gates 12 indicated by the symbol ∩. The pipeline registers 24 are controlled by a common system clock signal on line 26. The pipeline register implementation allows the supply of the various bits to the bit manipulation cells 10 to be synchronised. In addition, the pipeline implementation may be useful where it is required to monitor or sample the binary vector at an intermediate stage of conversion.

Referring now to FIG. 3, there is illustrated a registered state machine implementation which again uses a similar two input, two output bit manipulation cell 10 similar to those of FIGS. 1 and 2. In this arrangement, the binary vector to be converted is supplied to one input 28 of a 2:1 multiplexer 30 which passes respective bits of the binary vector to respective outputs 32 of the multiplexer which are connected to the inputs of the first layer of bit manipulation cell. For illustration only, in this example the input layer comprises an even number of bit manipulation cells 10, although in the embodiments it may be odd. The outputs of the first layer 31 of bit manipulation cells are supplied to a staggered set of the second layer 33, comprising an odd number of bit manipulation cells 10. The outputs of the second layer bit manipulation cells, together with the outermost output of each of the two end cells of the input layer are supplied to a register 34. The output of the register 34 is fed back to the other (feedback) input 36 of the 2:1 multiplexer 30. The 2:1 multiplexer is operated by a control logic processor 38, and the control logic processor and the output register 34 each receive a common clock signal from a system clock 40.

In operation, the control logic processor 38 element sets the 2:1 multiplexer to receive the input binary vector and thereafter the bits are manipulated by the two layers 31, 33 before being stored in the output register 34. The control logic processor 38 then causes the contents of the register 34 to be supplied to the feedback terminal 36 and this process is repeated according to the number of bits set, to provide a similar sequence of operations to the embodiments of FIGS. 1 and 2 so that at the end of the clock cycle sequence the corresponding thermometer code is presented on the register 34.

As noted above, the number of layers required is determined by the maximum width of the binary vector. If the system is intended to operate primarily with vectors having an odd number of bits, then, as shown in the dotted box in FIG. 3, a final output layer 35 of bit manipulation cells may be provided at the output of the register 34 to effect a logic manipulation on the bits to present the thermometer code at the output of the layer 35. Thus in the example shown (01100101) is presented at the input 28 with the output (1111000) presented at the output of the final layer 35.

The arrangements of FIGS. 1 to 3 employ a two bit cell in a lattice structure, but it is also possible to provide a similar structure which employs 3,4 etc bits. As noted above, for a 2 bit cell, the manipulator equations are:

$$Ya = a \# b$$

$$Yb = a \& b, \quad \text{(Equation Set (1))}$$

where # is the OR function and & is the AND function, a and b are the inputs and Ya and Yb are the corresponding outputs.

For a three bit cell, with inputs a, b, c, and outputs Ya, Yb, Yc, the manipulator equations are:

$$Ya = a \# b \# c$$

$$Yb = (b \& c) \# (a \& c) \# (a \& b)$$

$$Yc = a \& b \& c \quad \text{(Equation Set (2))}$$

Similarly for a four bit cell, with inputs a, b, c, d, and outputs Ya, Yb, Yc, Yd, the manipulator equations are:

$$Ya = a \# b \# c \# d$$

$$Yb = (d \& c) \# (d \& b) \# (d \& a) \# (c \& b) \# (c \& a) \# (b \& a)$$

$$Yc = (d \& c \& b) \# (d \& c \& a) \# (d \& b \& a) \# (c \& b \& a)$$

$$Yd = a \& b \& c \& d \quad \text{(Equation Set (3))}$$

The manipulator equations for more than 4 bit cells follow a similar pattern.

Figure 4A:
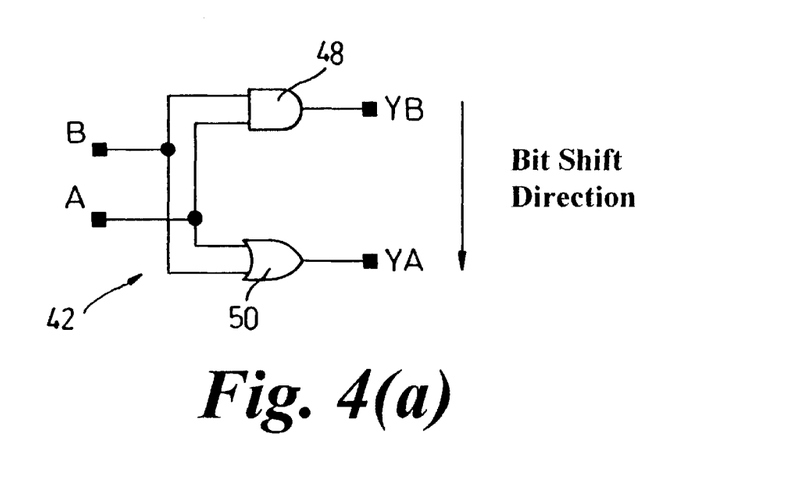
Figure 4B:
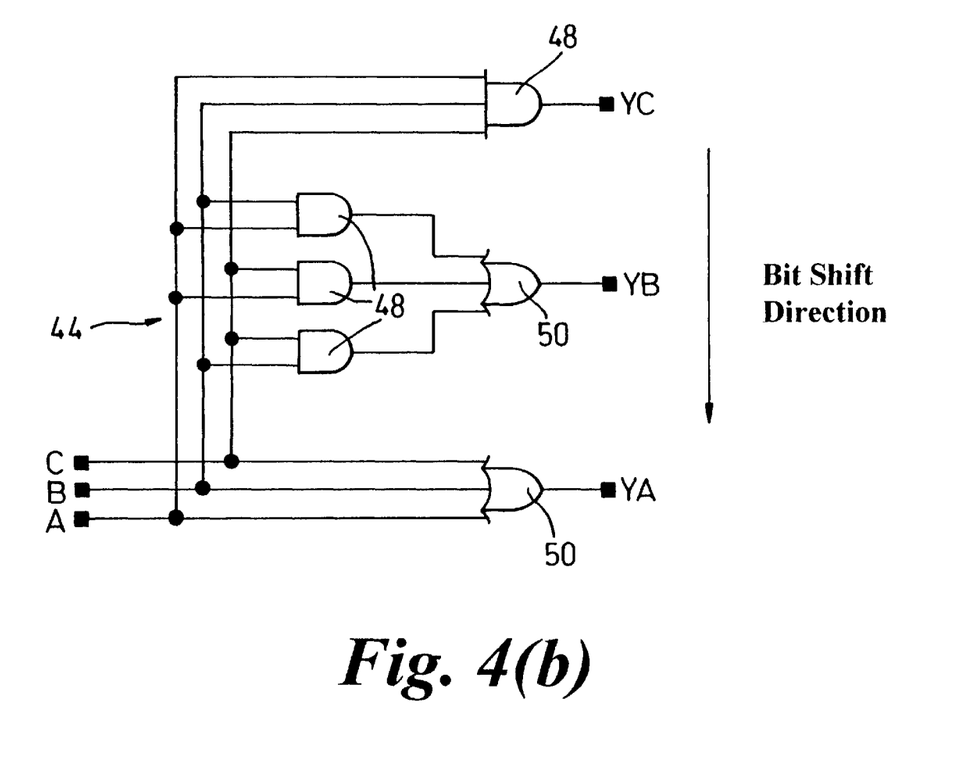
Figure 4C:
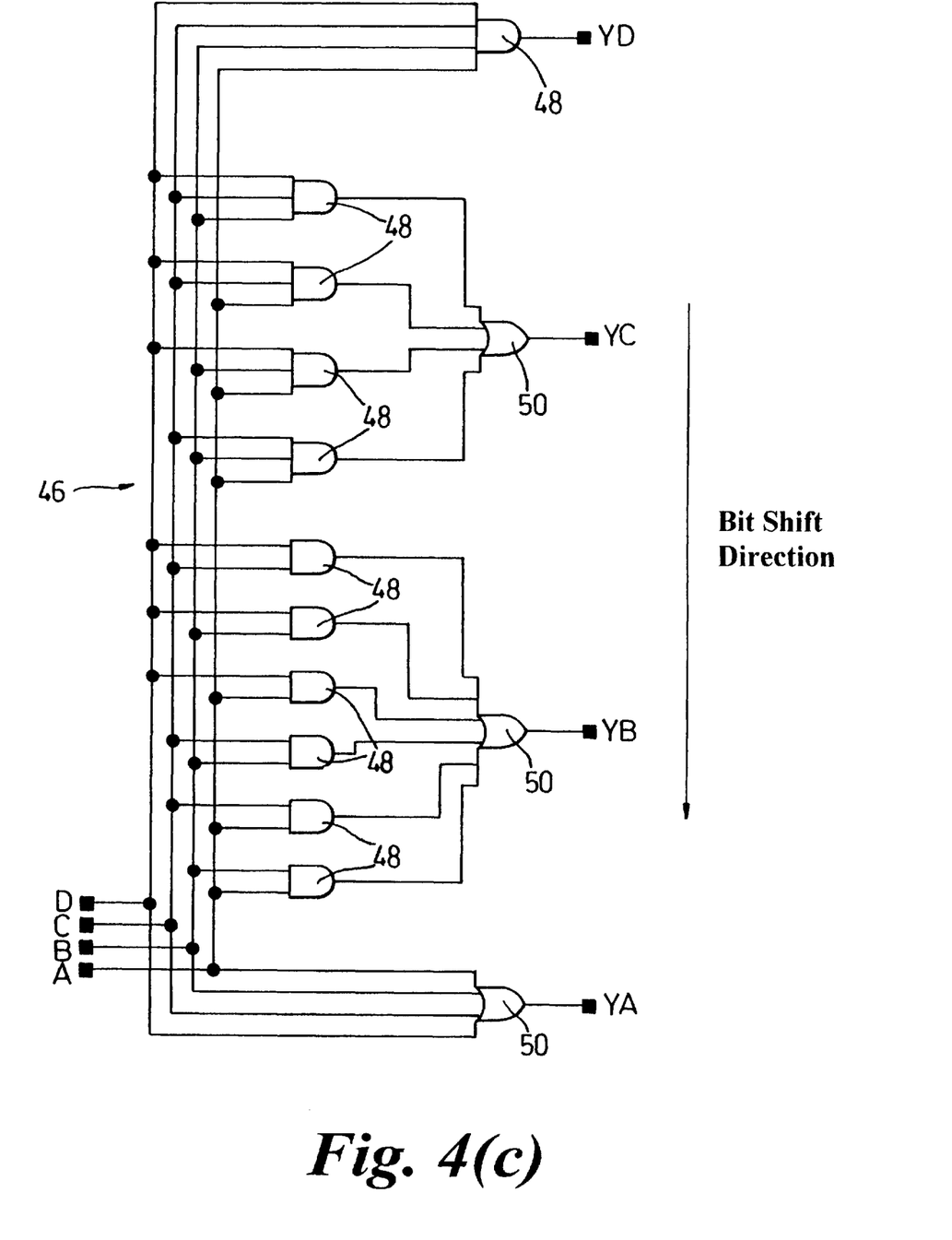

FIGS. 4(*a*), 4(*b*) and 4(*c*) show logic circuits for 2-, 3- and 4-bit manipulator cells 42, 44, 46 respectively. In each case the cells are made up of AND and OR gates referenced 48 and 50 respectively and act to shift set bits downwardly as viewed in the Figures.

Figure 5:
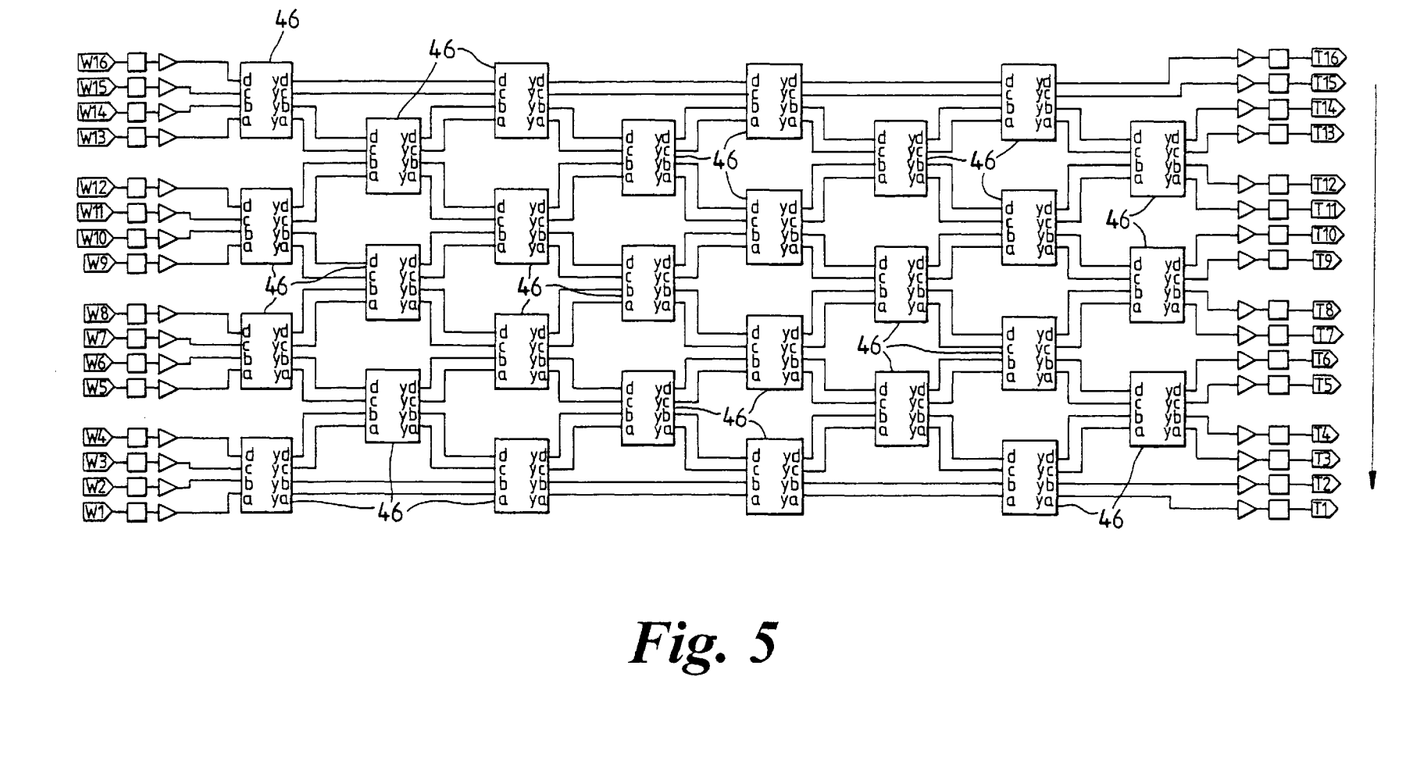
FIG. 5 is a block diagram of a 16 bit thermometer code converter made up of an array of 4-bit manipulator cells.
Figure 6:
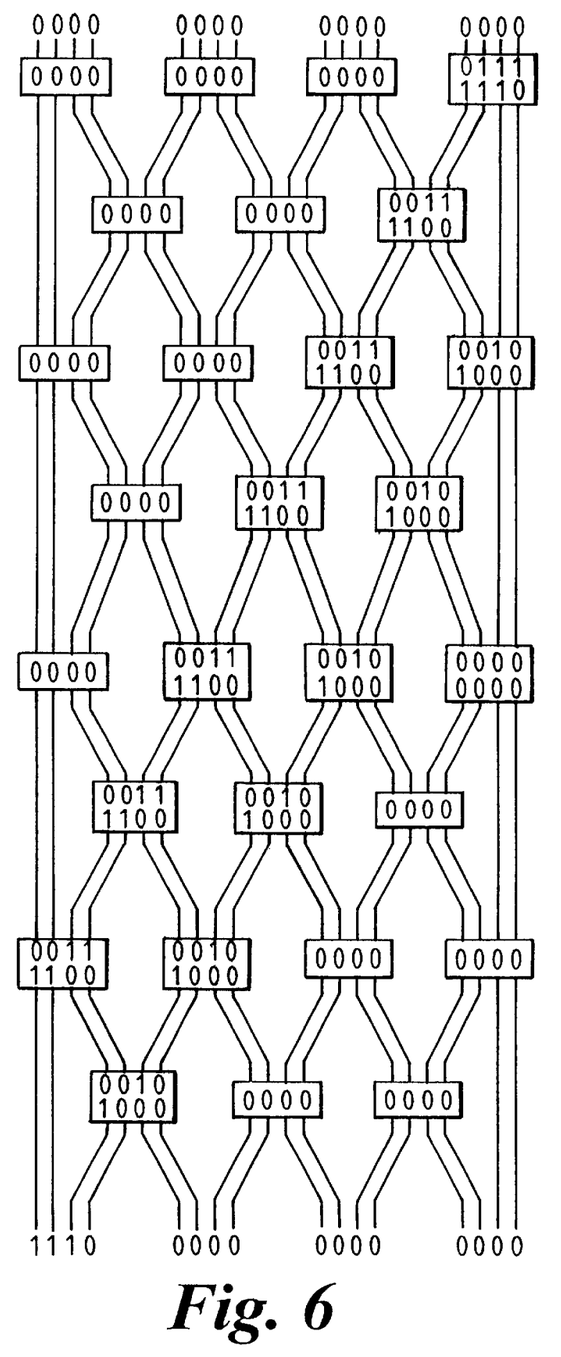
FIG. 6 is a worked example of the array of FIG. 5 showing conversion of a 16 bit binary vector shifting 1's to the left hand end.
Figure 7:
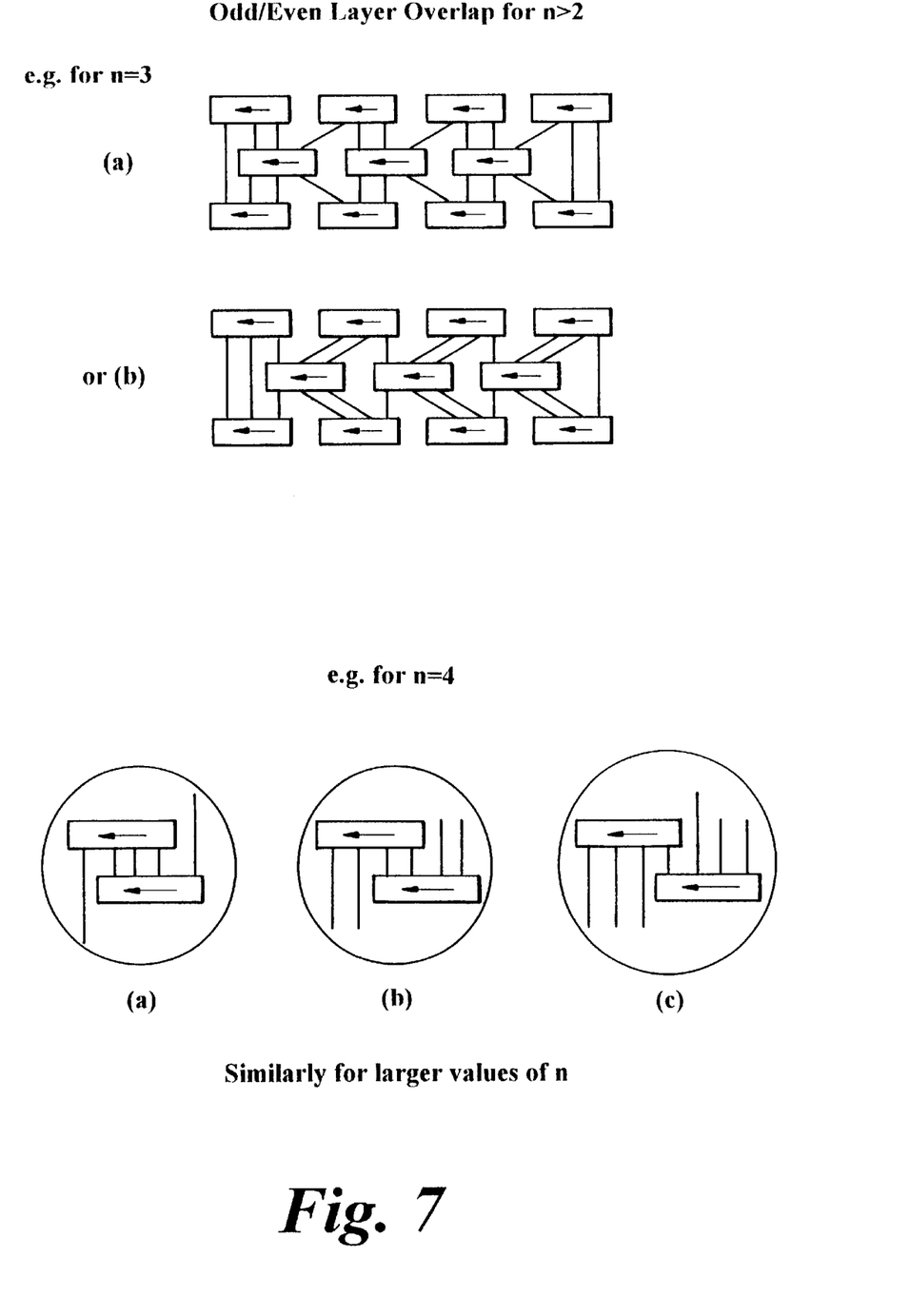
FIG. 7 is a schematic diagram showing overlap possibilities for 3- and 4-bit manipulation cells.

FIG. 5 is a block diagram of another embodiment of a thermometer code converter made up of an array of four bit manipulation cells 48 to convert a 16-bit binary vector, and FIG. 6 is a worked example showing the stages of the conversion. It will be noted that there is an overlap or offset between adjacent odd/even layers of the array of FIG. 5. There has to be such an overlap to allow odd/even bits to migrate across boundaries in successive layers. There are several possibilities with examples being given in FIG. 7, for 3- and 4-bit cells. Thus, as shown in the upper part of FIG. 7, the overlap for 3-bit cells may be 1- or 2-bits, and, as shown in the lower part of FIG. 3(*g*), the overlap for a four bit cell may be 3 bits, 2 bits or 1 bit.

It should also be noted that, by appropriate reconfiguration of the bit manipulation cells it is possible to shift the bits from both ends of the string into the middle for applications requiring a centered thermometer code; indeed it is possible to shift the bits into any output bit position by arrangement of the cells in a lattice structure. For example, to shift the set bits to the centre the array could be constructed so that, in function at least, the bit manipulator cells were symmetric about a centre line corresponding to the origin or principle bit position in the output array around which the set bits are required to cluster or aggregate. Thus cells above this line in the array would shift set bits downwards; those below the line would shift set bits upwardly, and those on the line shifting the bits towards the centre (if greater than 2 bits), otherwise following a preset rule. With 2 bit cells, the array would be effectively divided into two separate thermometer code converters working in parallel, with the end left hand one shifting set bits to the right hand end of the string, and the right hand one shifting set bits to the left hand end of the string.

The above arrangements provide a weightless binary string to thermometer code converter based on a cellular array parallel processing structure. The inherent parallelism makes these embodiments particularly suitable for high speed operation. They may be implemented as hard wired logic field programmable gate arrays, gate arrays, applications specific integrated circuits or custom large scale integration devices, and as such are more fault-tolerant than alternative weighted binary microprocessor implementations. As to be described later below, the principles herein may also be applied the two-dimensional arrays, to effect what we term planar aggregate code converter where the set 1's are shifted towards a particular pole or focus.

Figure 8:
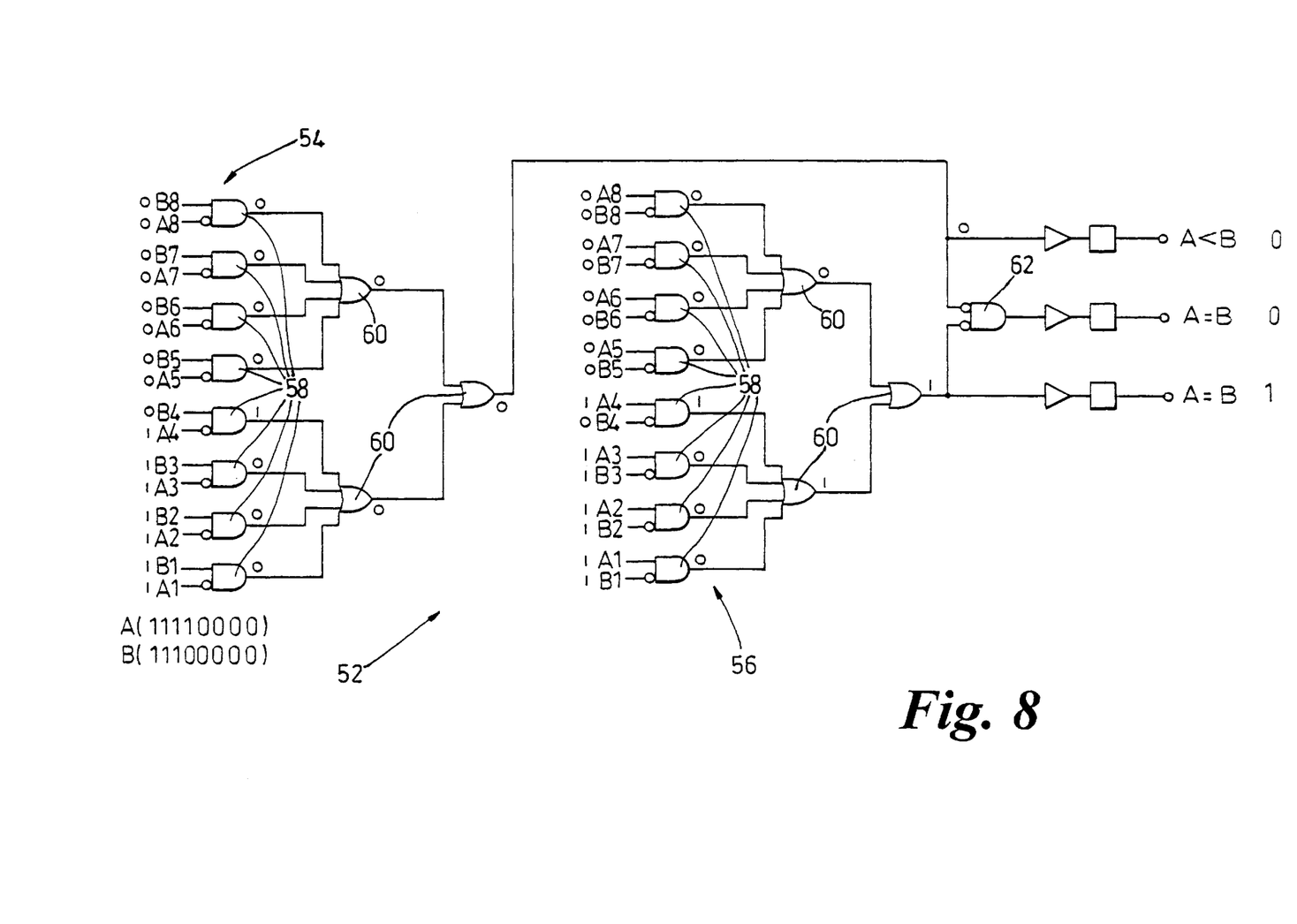
FIG. 8 is a circuit diagram of an embodiment of a thermometer code comparator in accordance with another aspect of this invention for determining the Hamming relationship of two thermometer codes.

Referring now to FIG. 8, the thermometer code comparator illustrated therein is required to have the property that when the Hamming value of a first thermometer code A is greater than the Hamming value of a second thermometer code B, then the A>B output shall be set high. Likewise when the Hamming value thermometer code A is less than that of the thermometer code B then the A<B output shall be set high, and when the Hamming values of the codes are the same, then the A=B output shall be set.

The comparator 52 comprises a first and a second similar array 54, 56 of logic elements 58, 60. In the first array, the corresponding bits from each thermometer code (A1, A2, A3, A4, A5, A6, A7, A8) and (B1, B2, B3, B4, B5, B6, B7, B8) are supplied to a corresponding number of AND gates 58, with the A bit being supplied to an inverting terminal of the AND gate 58 and the B bit being supplied to a non-inverting terminal. The outputs of the AND gates are "ORed" together by OR gates 60. Inspection of the first array will show that the output from the OR gate will be high if, at any particular bit position in the vectors, the A bit is zero and the B bit is one. Given that the binary input vectors B and A are both in thermometer code, a "high" output from the OR gate indicates that the Hamming value of B is greater than the Hamming value of A.

The second array is similar to that of the first array except that the B and A inputs are reversed. The outputs of the AND gates 58 are ORed together by OR gates 60 as previously. The output of the OR gates 60 is high if the Hamming value of thermometer code A is greater than the Hamming value of the thermometer code B.

The outputs of the respective output OR gates from both arrays 56, 58 are also inverted and supplied to an AND gate 62. Accordingly, the output A>B goes high if the Hamming value of A is greater than that for B, the output A=B goes high if the Hamming values are equal, and the output A<B goes high if the Hamming value of A is less than that of B.

This arrangement provides an ultra-fast parallel implementation. This example shows the word length of 8 bits, but the architecture is extensible to deal with other word lengths as required. The architecture may also be integrated within a state machine or as an operation within a bit slice computer or microprocessor. The comparator may be employed as a threshold function in an artificial weightless neural network, and is also suited to voting/majority logic systems, and there are many possible applications within digital communication systems. The comparator as illustrated is considerable faster than state machine, conventional microprocessor, or weighted binary counter based alternatives.

Planar Aggregate Code Converter

The embodiments of FIGS. 1 to 5 effect the conversion of 1-dimensional strings of weightless binary bits into thermometer code, and in more general terms may be reconfigured to aggregate the set bits to a selected end of the string or around a selected bit position, e.g. the centre one. We have found that the same technique can be applied to 2-dimensional arrays of weightless bits to aggregate or cluster the set bits around or towards a selected bit position, for example a selected corner of the array. This is referred to herein specifically as planar aggregate code formation, and is more generally embraced by the term thermometer code.

Figure 9:
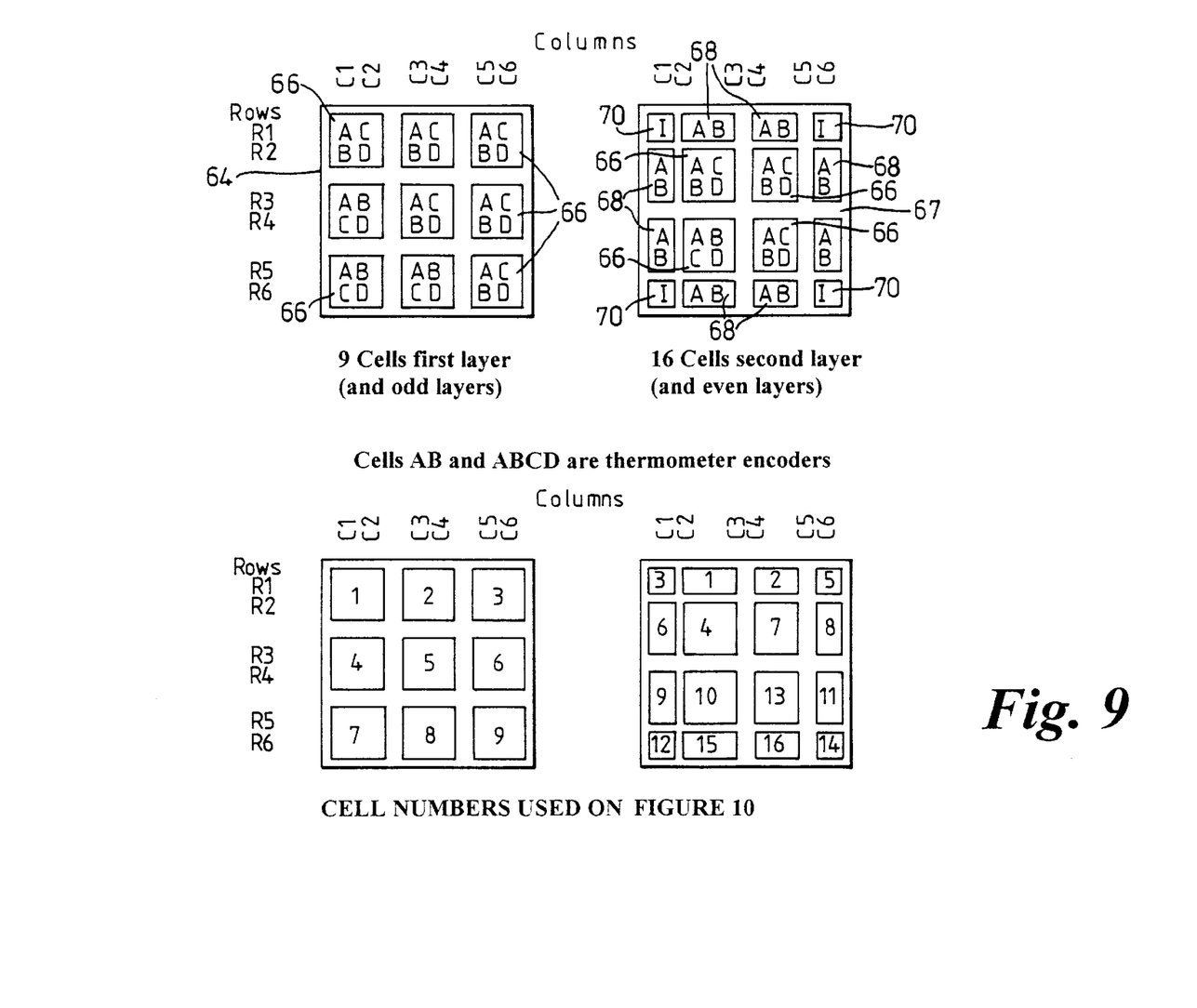
FIG. 9 is a diagrammatic representation of the odd and even layers, and the cell number identification used in an embodiment of planar aggregate code converter in accordance with the invention and illustration in FIG. 10.
Figure 10:
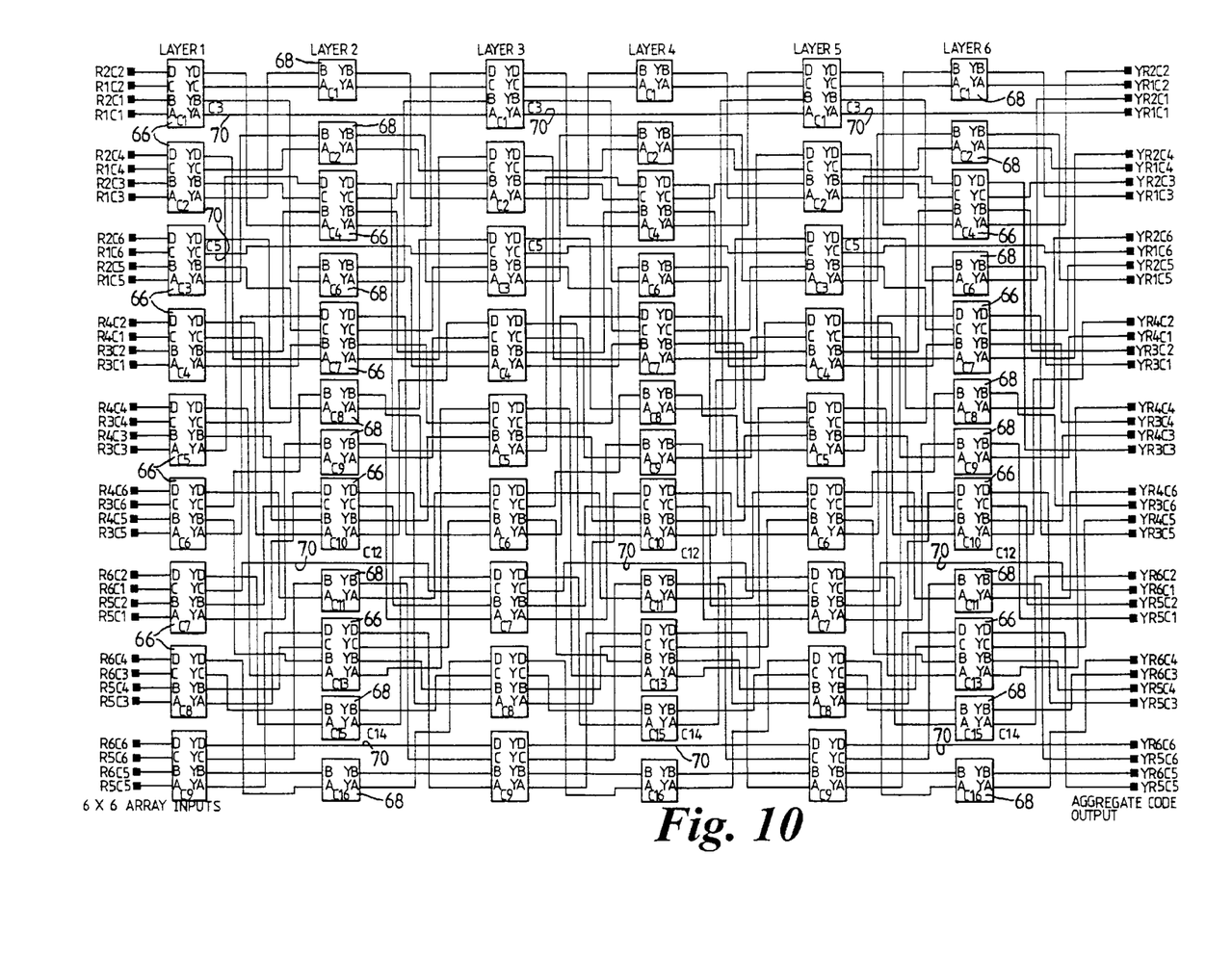
FIG. 10 is a schematic diagram of a planar aggregate code converter.
Figure 11:
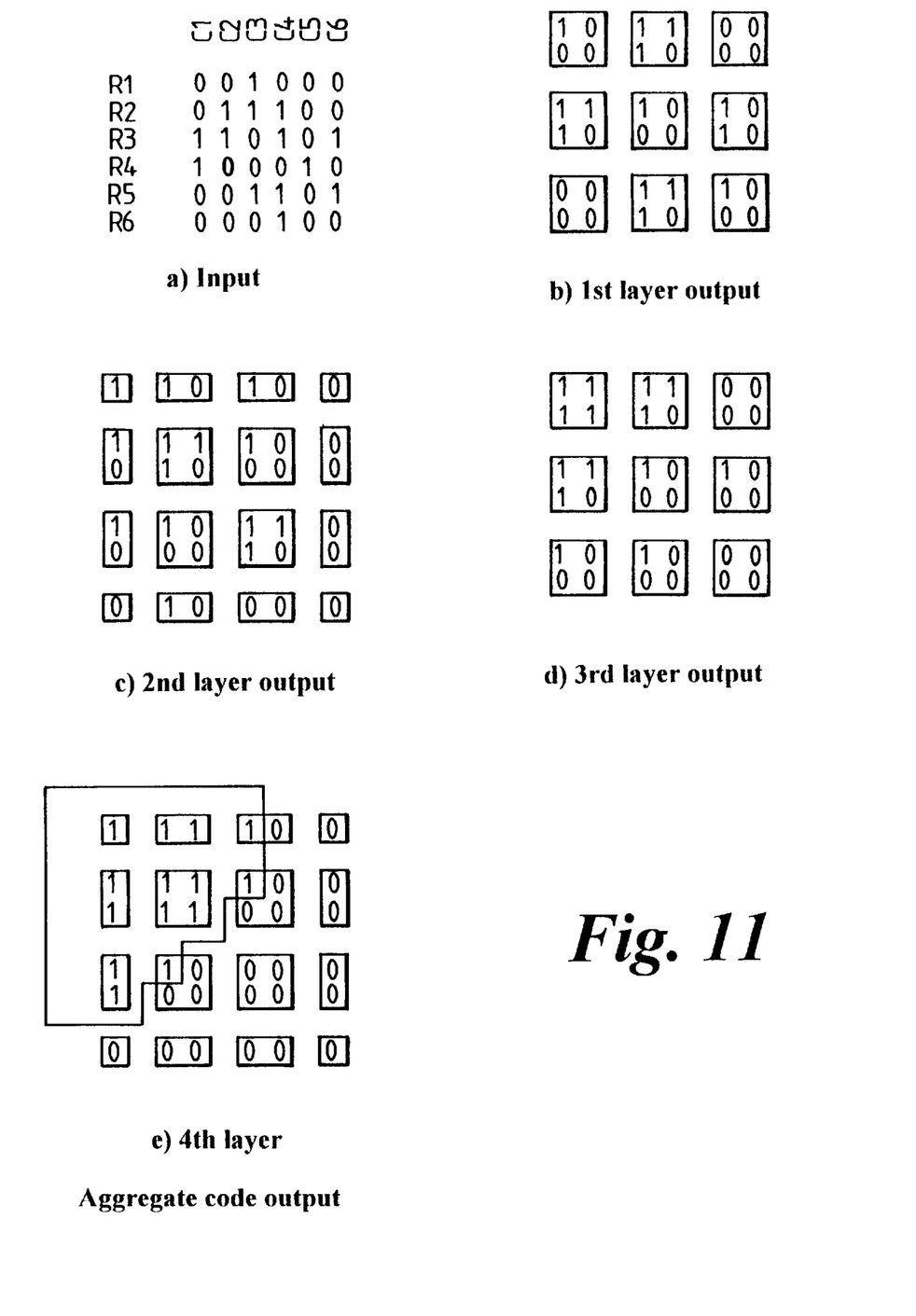
FIG. 11 is a worked example of the planar aggregate code converter illustrated in FIG. 18.

FIGS. 9 to 11 illustrate an arrangement for a 6×6 array of bits in which the bits are shifted towards the upper left corner of the 2-dimensional array, although the technique could be modified to aggregate the bits into the centre or any other output bit position. Likewise arrangements for more or less than 6 bits can of course be constructed using the principles embodied in FIGS. 9 to 11, and the construction of such arrays is well within the competence of one skilled in the art.

As in the one-dimensional case, the planar aggregate code converter is made up of alternate odd and even layers of similar structure, with an offset or overlap between adjacent layers.

FIG. 9 shows the structure of the odd and even layers, and their identification numbers used in FIG. 10. Referring to the top left hand side of FIG. 9, the structure of the first and odd layers is shown The first (input) layer 64 segments the 6×6 array into nine 2×2 tuples 66 {a, b, c, d} and the tuples are converted into thermometer code thus polarising the segments, with 1's moving towards 'a' and 0's moving towards 'd'. The Boolean equations required to implement this function are as set out in Equation Set (3) above (see page 6).

It will be seen that the first and odd layers 64 thus have the property that bits {abcd} are shifted in the direction of a. The symmetry of this arrangement about the diagonal running from top left to bottom right should be noted. The cells above and on the axis of symmetry run:

$$\begin{pmatrix} A & C \\ B & D \end{pmatrix}$$

whereas those below the axis of symmetry run:

$$\begin{pmatrix} A & B \\ C & D \end{pmatrix}$$

The results of the first and odd layers are fed straight into the corresponding cells in the next layer 67 which consists of offset structures as shown in the top right hand side of FIG. 9. For ease of reference the layers in FIG. 9 are identified by a coordinate system comprising rows R1 to R6 and columns C1 to C6. The output from the first layer at a given coordinate (Cn Rm) passes as an input to the corresponding coordinate (Cn Rm) in the next layer. The even layers are made up of a plurality of 4 bit manipulator cells 66, {a, b, c, d}, a plurality of peripheral 2-bit manipulator cells 68 {a,b} and straight feed throughs 70 in the four corners. Again each manipulator cell (whether 2 bit or 4 bit) is a thermometer code converter shifting 1's towards 'a'. For the two bit manipulator cells and Boolean logic described in Equation Set (1) above.

The processes of the odd and even layers are repeated until the output is polarised into aggregate code.

FIG. 10 is a two dimensional circuit diagram of a 6 layer lattice structure for planar aggregate code formation of a 6×6 input, made up of the 4-bit manipulator cells 76 and the 2-bit manipulator cells 68.

In this structure the layers 1, 3, 5 are odd layers having the structure shown in upper left of FIG. 9 and the layers 2, 4, 6 have the structure shown in the upper right of FIG. 9. The cell numbers of the cells in the odd and even layers are used in accordance with the scheme in the lower half of FIG. 9 and again the coordinate system may be used. Even layer feedthroughs 70 at C3, C5, C12 and C14 are identified, passing directly between cells in successive odd layers.

FIG. 11 is a worked example showing aggregate code formation of a 6×6 array using the arrangement of FIG. 10. This example is stable in four layers, but in general for a 6×6 array, 6 layers are required to cope with all possible code inputs.

When constructing larger or smaller arrays, the same general principles apply. It should be noted that for large arrays it is possible to use small or large thermometer encoder blocks, and mixtures of block sizes are possible, and it would be possible to provide arrangements in which the layers were not alternatively similar.

Hybrid Sum and Threshold Element with Weightless Synaptic Inputs and Weighted Binary Threshold The weightless binary to thermometer code converters described above may be configured for use as a sum and threshold element. Thus a sum and threshold element has been designed that accepts a weightless binary input and a weighted binary threshold.

Figure 12:
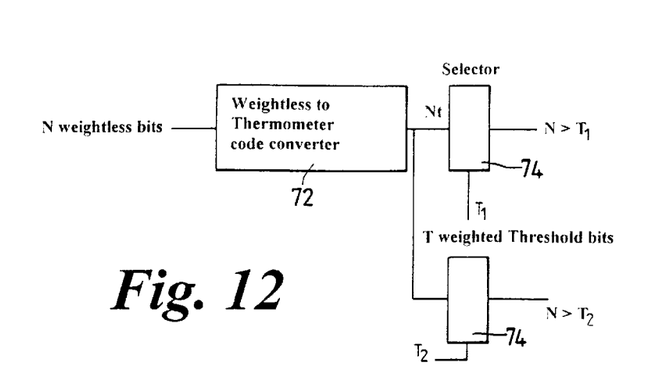
FIG. 12 is a diagram of a sum and threshold element with weightless synaptic inputs and a weighted binary threshold.

FIG. 12 shows a general arrangement of a sum and threshold element with weightless synaptic inputs and a weighted binary threshold. N weightless bits are supplied to a thermometer code converter 72 to obtain thermometer code $N_t$, which is passed to one or more selectors 74, each of which also receives a respective weighted binary threshold value $T_1$, $T_2$, etc. The selector 72 decodes the weighted threshold value and looks at the appropriate bit position in the thermometer code $N_t$, and if set (indicating that the thermometer code has a Hamming value greater than the specified threshold), the selector sets is output bit to indicate that N>T.

Figure 13:
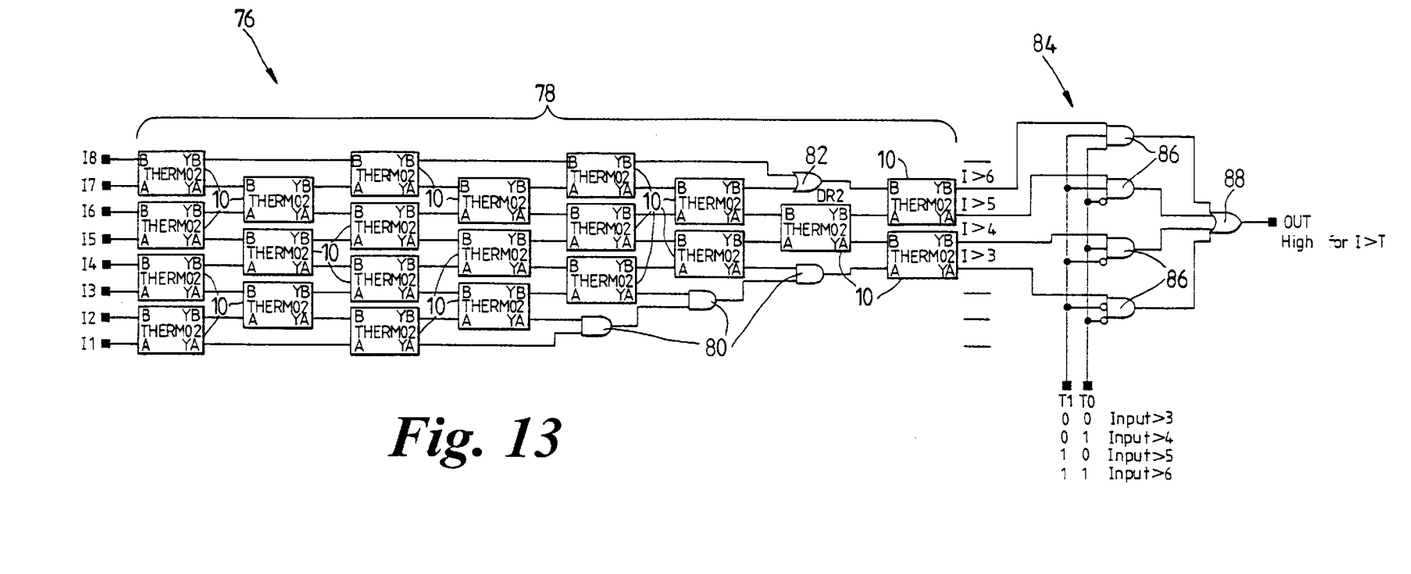
FIG. 13 is a diagram of a sum and threshold element of the type in FIG. 12, employing a thermometer code converter as herein described.

FIG. 13 is a circuit diagram of an example of a sum and threshold device having eight synaptic inputs and a choice of four thresholds. The device 76 comprises a thermometer code converter section 78 similar structure to that of FIG. 1, made up of 2-bit manipulator cells 10 of the type shown in FIG. 4(a). It should be noted that in the device of FIG. 13, there are eight inputs, thus requiring odd layers nominally of four 2-bit manipulator cells 10 and even layers nominally of three 2-bit manipulator cells, making up eight layers in all, although the fifth to eighth layers have been truncated in this case. The thresholds are I>6, I>5, I>4 and I>3, meaning that only the fourth to seventh outputs (from the bottom of the array as viewed) are required. Because of the truncation, the fifth to seventh layers include AND gates 80 at the lower truncation boundary, and the seventh layer includes an OR gate 82.

The output of the thermometer code conversion section 78 passes to a weighted binary selector 84 which acts as a threshold decoder. Such devices are already known for use as binary multiplexers or logical selectors. In this example, which allows selection of one of four threshold values 3, 4, 5, 6, the selector 84 comprises two weighted inputs which are each connected to the inputs of 3-input AND gates 110, the other input of each AND gate being a respective output of the thermometer code converter. Selected terminals of the lower three AND gates are inverted, and the outputs of the AND gates 86 pass to an OR gate 88. Different permutations of 0's and 1's applied to the weighted inputs select different bit positions at the output of the binary converter.

The selector has the following mapping:

| Inputs | | Thermometer Code Bit Position |
|---|---|---|
| 0 | 0 | 4 |
| 0 | 1 | 5 |
| 1 | 0 | 6 |
| 1 | 1 | 7 |

Thus if the weighted input is (1,0) the device will fire only if the Hamming value of the weightless input is greater than 5.

If two or more thresholds are to be applied, then further weighted binary selectors could be connected to the output of the thermometer code converter.

It will be appreciated also that the circuit could be simplified to respond to a given specific threshold; in this instance a binary selector as such would not be required and instead the output of the thermometer code converter corresponding to the $T_{fixed}+1$, where $T_{fixed}$ is the fixed threshold, would be the output.

What is claimed is:

1. An encoder for converting a weightless binary array of one or more dimensions into a thermometer code as herein defined, said encoder comprising means for inputting said weightless binary array into processing means having a succession of one or more layers of bit manipulation cells each cell including at least two inputs and at least two outputs, and arranged to shift set bits in said array in the direction of a selected portion of said array, thereby to provide said thermometer code.

2. An encoder according to claim 1, wherein said processing means is operable to shift said set bits to one end of the array.

3. An encoder according to claim 1, wherein said processing means is operable to shift said set bits towards the centre of the array.

4. An encoder according to claim 1, wherein said processing means comprises a plurality of bit manipulation cells each comprising two inputs and two outputs.

5. An encoder according to claim 4, wherein on application of inputs (a, b) the bit manipulation cells provide outputs (Ya, Yb) as follows:
   Ya=a # b
   Yb=a & b,
   where # is the OR function and & is the AND function.

6. An encoder according to claim 1, wherein said processing means comprises a plurality of bit manipulation cells each comprising three inputs and three outputs.

7. An encoder according to claim 6, wherein on application of three inputs (a, b, c,) the manipulation cell provides outputs (Ya, Yb, Yc), as follows:
   Ya=a # b # c
   Yb=(b & c) # (a & c) # (a & b)
   Yc=a & b & c.

8. An encoder according to claim 1, wherein said processing means comprise a plurality of bit manipulation cells each comprising four inputs and four outputs.

9. An encoder according to claim 8, wherein on application of four inputs (a, b, c, d), the manipulation cell provides outputs (Ya, Yb, Yc, Yd) as follows:

Ya=a # b # c # d
Yb=(d & c) # (d & b) # (d & a) # (c & b) # (c & a) # (b & a)
Yc=(d & c & b) # (d & c & a) # (d & b & a) # (c & b & a)
Yd=a & b & c & d.

10. An encoder according to claim 1, wherein the processing means comprises alternate odd and even layers of respective odd and even numbers of bit manipulation cells.

11. An encoder according to claim 10, wherein in the odd layers the bit manipulation cells operate on adjacent bits starting on an even boundary of the binary string, and in the even layers, the bit manipulation cells operate on adjacent bits starting on an odd boundary of the binary string.

12. An encoder according to claim 1 wherein said processing array is asynchronous.

13. An encoder according to claim 1, including pipeline register means arranged after one or more of said layers of manipulation cells for storing a partially converted string.

14. An encoder according to claim 1, configured as a registered state machine comprising at least two adjacent layers of bit manipulation cells, an output register for storing a partially or wholly converted binary string from the lowermost layer, and means operable to pass a partially converted string from said register to the input of the uppermost layer, and output means for outputting said thermometer code.

15. An encoder according to claim 14 which includes a further layer of bit manipulation cells for operating on the output of said output register where an odd number of layers is required.

16. A method for converting a weightless binary array of at least one dimension into a thermometer code, said method comprising the steps of:
   applying said weightless binary array to a processor having a succession of at least one layer of bit manipulation cells, each cell including at least two inputs and at least two outputs, thereby successively to shift set bits in said array in a direction of a selected portion of said array, thereby providing said thermometer code.

17. An encoder for converting a weightless binary sting into a binary code, comprises a plurality of inputs, a plurality of outputs, and a plurality of logic elements for shifting set bits applied to said inputs in a given direction.

18. An encoder according to claim 1, wherein said processing means comprises alternate layers, ones of said layers comprising an array of 4-bit manipulator cells, and others of said layers comprising a central array of 4-bit manipulator cells with peripheral 2-bit manipulator cells and pass throughs.

19. A sum and threshold device comprising an encoder according to claim 1, and means for selecting a bit position at the output of said encoder, thereby to apply a threshold.

20. A sum and threshold device according to claim 19, including one or more further selection means thereby to apply a plurality of thresholds.

21. A sum and threshold device according to claim 19, wherein the or each selection means comprises a weighted binary selector.

22. An encoder for converting a weightless binary array of at least one dimension into a thermometer code, said encoder comprising an input array for inputting said binary weightless array into a processor, said processor having a succession of at least one layer of bit manipulation cells, each of said cells including at least two inputs and at least two outputs, and arranged to shift set bits in said array in the direction of a selected portion of said array, thereby providing said thermometer code.

23. An encoder according to claim 22, wherein said processor is operable to shift said set bits to one end of the array.

24. An encoder according to claim 22, wherein said processor is operable to shift said set bits towards the center of the array.

25. An encoder according to claim 22, wherein said processor comprises a plurality of bit manipulation cells each comprising two inputs and two outputs.

26. An encoder according to claim 25, wherein on application of inputs (a, b), the manipulator cell provides outputs (Ya, Yb) as follows:

Ya=a # b

Yb=a & b, where # is the OR function and & is the AND function.

27. An encoder according to claim 22, wherein said processor comprises a plurality of bit manipulation cells each comprising three inputs and three outputs.

28. An encoder according to claim 27, wherein on application of three inputs (a, b, c,), the manipulation cell provides outputs (Ya, Yb, Yc), as follows:

Ya=a # b # c

Yb=(b & c) # (a & c) # (a & b)

Yc=a & b & c.

29. An encoder according to claim 22, wherein said processor comprise a plurality of bit manipulation cells each comprising four inputs and four outputs.

30. An encoder according to claim 29, wherein on application of four inputs (a, b, c, d), the manipulation cell provides outputs (Ya, Yb, Yc, Yd) as follows:

Ya=a # b # c # d

Yb=(d & c) # (d & b) # (d & a) # (c & b) # (c & a) # (b & a)

Yc=(d & c & b) # (d & c & a) # (d & b & a) # (c & b & a)

Yd=a & b & c & d.

31. An encoder according to claim 22, wherein the processor comprises alternate odd and even layers of respective odd and even numbers of bit manipulation cells.

32. An encoder according to claim 31, wherein in the odd layers the bit manipulation cells operate on adjacent bits starting on an even boundary of the binary string, and in the even layers, the bit manipulation cells operate on adjacent bits starting on an odd boundary of the binary string.

33. An encoder according to claim 22, wherein said processing array is asynchronous.

34. An encoder according to claim 22, including a pipeline register arranged after one or more of said layers of manipulation cells for storing partially converted string.

35. An encoder according to claim 22, configured as a registered state machine comprising at least two adjacent layers of bit manipulation cells, an output register for storing a partially or wholly converted binary string from the lowermost layer, and said registered state machine operable to pass a partially converted string from said register to the input of the uppermost layer, and an output for outputting said thermometer code.

36. An encoder according to claim 35 which includes a further layer of bit manipulation cells for operating on the output of said output register where an odd number of layers is required.

37. An encoder for converting a weightless binary 2-dimensional array binary data bits to aggregate set bits in said data around a pre-set location, said encoder comprising an input array for inputting said 2-dimensional array of data into a processor, said processor comprising a plurality of layers of bit manipulation cells, each cell including at least two inputs and outputs, with said bit manipulation cells being interconnected between layers thereby collectively to shift set bits in said string towards said preset location.

38. An encoder according to claim 37, wherein said processor comprises alternate layers, ones of said layers comprising an array of 4-bit manipulator cells, and others of said layers comprising a central array of 4-bit manipulator cells with peripheral 2-bit manipulator cells and pass throughs.

39. A sum and threshold device comprising an encoder according to claim 22 and a selector for selecting a bit position at the output of said encoder, thereby to apply a threshold.

40. A sum and threshold device according to claim 39, including one or more further selectors thereby to apply a plurality of thresholds.

41. A sum and threshold device according to claim 39, wherein said one or more selectors comprise a weighted binary selector.

42. An encoder for converting a weightless binary array of at least one dimension into a thermometer code, said encoder comprising a processor having as an input, said binary weightless array, said processor having a succession of at least one layer of bit manipulation cells, each of said cells including at least two inputs and at least two outputs, and arranged to shift set bits in said array in the direction of a selected portion of said array, thereby providing said thermometer code.

\* \* \* \* \*